United States Patent [19]

Tran

[11] Patent Number: 5,093,806
[45] Date of Patent: Mar. 3, 1992

[54] SENSING AND DECODING SCHEME FOR A BICMOS READ/WRITE MEMORY

[76] Inventor: Hiep V. Tran, 1816 Woodbury, Carrollton, Tex. 75007

[21] Appl. No.: 366,053

[22] Filed: Jun. 13, 1989

Related U.S. Application Data

[63] Continuation-in-part of Ser. No. 4,862,421, Aug. 29, 1989.

[51] Int. Cl.$^5$ .............................................. G11C 7/00
[52] U.S. Cl. ............................ 365/189.11; 365/189.06
[58] Field of Search ............... 365/154, 189.06, 189.11

[56] References Cited

U.S. PATENT DOCUMENTS

| | | | |
|---|---|---|---|
| 4,195,356 | 3/1980 | O'Connell et al. | 365/189.11 |
| 4,723,228 | 2/1988 | Shah et al. | 365/189.05 |
| 4,825,413 | 4/1989 | Tran | 365/189.06 |

Primary Examiner—James W. Moffitt

[57] ABSTRACT

A BICMOS static random access memory (SRAM) is disclosed, which has first and second stage sense amplifiers. Each column in the memory array is associated with a first stage sense amplifier, and the first stage sense amplifiers are arranged in groups, with each group connected in wired-OR fashion to a pair of local data lines. The column address is used to select one of the first stage sense amplifiers for sensing the state of the memory cell in the selected column. One second stage sense amplifier is associated with each group of first stage sense amplifiers, and the second stage sense amplifier associated with the group containing the selected first stage sense amplifier is selected, according to the most significant bits of the column address. The second stage sense amplifiers are connected to a data-out bus in wired-OR fashion, with the output of the selected second stage sense amplifier driving the data-out bus.

17 Claims, 7 Drawing Sheets

TO SECOND STAGE SENSE AMP $14_0$

SENSING AND DECODING SCHEME FOR A BICMOS READ/WRITE MEMORY

This application is a continuation-in-part of U.S. Pat. No. 4,862,421, issued Aug. 29, 1989.

This application is related to copending application Ser. No. 326,755, filed Mar. 21, 1989, which is a continuation of U.S. Pat. No. 4,825,413, issued Apr. 25, 1989, and is also related to U.S. Pat. No. 4,866,674, issued Sept. 12, 1989 and application Ser. No. 310,796 filed Feb. 14, 1989. All of these applications are assigned to Texas Instruments Incorporated.

This invention is in the field of electronic integrated circuits, and is specifically directed to circuits for use in read/write memory devices.

BACKGROUND OF THE INVENTION

Integrated circuit memory devices are often organized into rows and columns of memory cells, with the rows and columns separately selected based on the value of the portions of the memory address which represent row and column addresses. In such devices, the term "word lines" generally refers to a set of conductors of which one, when active, selects the addressed row of memory cells; the term "bit lines" generally refers to a set of conductors which communicate data between memory cells in the addressed row and a sense amplifier. The sense amplifier is a circuit which senses the data state of the data on an associated bit line, and which generally amplifies the sensed data state for communication to output stages of the circuit.

Due to the drive capability of static memory cells, where the memory cell consists of a latch, multiple columns in many static random access memories (SRAMs) share a single sense amplifier. For purposes of sensing resolution, however, generally the shorter the bit lines associated with a single sense amplifier, the smaller the differential voltage which is detectable by a sense amplifier. It is therefore preferable for purposes of sensing to provide a single sense amplifier for each column in the memory cell array.

However, the provision of the many sense amplifiers required to have one sense amplifier per column increases the load that a particular sense amplifier is required to drive. In a 256 kbit SRAM organized into 256 rows by 1024 columns, for example, 1024 sense amplifiers must be provided for a one-to-one correspondence between sense amplifiers and columns The sense amplifier which is associated with the selected column must thus be capable of driving a data line which is connectable to the 1023 other sense amplifiers. The capacitive load of such a long data line, especially including the parasitic load provided by isolation transistors decoupling the unselected sense amplifiers from the data line, either requires the provision of large drive transistors in each sense amplifier, or results in reduction in read access time performance. It should be noted that in the architecture where a single sense amplifier is provided for each column, the space required for a sense amplifier in one dimension (i.e., the sense amplifier pitch) can be no greater than the space required for providing a column of memory cells (i.e., the column pitch), without significantly expanding the size of the integrated circuit required for incorporating the SRAM device; such a pitch constraint will, of course, limit the size of the drive transistors which can be provided within the sense amplifier.

It is therefore an object of this invention to provide a sensing and decoding scheme for a static RAM device which allows for a reduced data line load for sense amplifiers.

It is a further object of this invention to provide such a scheme for an SRAM having a single sense amplifier for each column of memory cells.

It is a further object of this invention to provide such a scheme realized in BiCMOS technology.

Other objects and advantages of the instant invention will become apparent to one of ordinary skill in the art having reference to the following specification, in conjunction with the accompanying drawings.

SUMMARY OF THE INVENTION

The invention may be incorporated into a BiCMOS SRAM read/write memory having a pair of complementary bit lines associated with each column of memory cells, and a first stage sense amplifier associated with each column. The first stage sense amplifiers are arranged into groups, each of the first stage sense amplifiers in a group driving a common pair of complementary data lines. A second stage sense amplifier is provided for each group, and all of the second stage sense amplifiers drive a pair of global data lines. The column address is decoded to select a single one of the first stage sense amplifiers; those first stage sense amplifiers not selected are disabled and present a high impedance to the local data lines. A number of the most significant bits of the column address are used to enable the second state sense amplifier associated with the group containing the selected first stage sense amplifier, with the others of the second stage sense amplifiers being disabled and presenting a high impedance to the global data lines.

DETAILED DESCRIPTION OF THE PREFERRED EMBODIMENT

Figure 1:
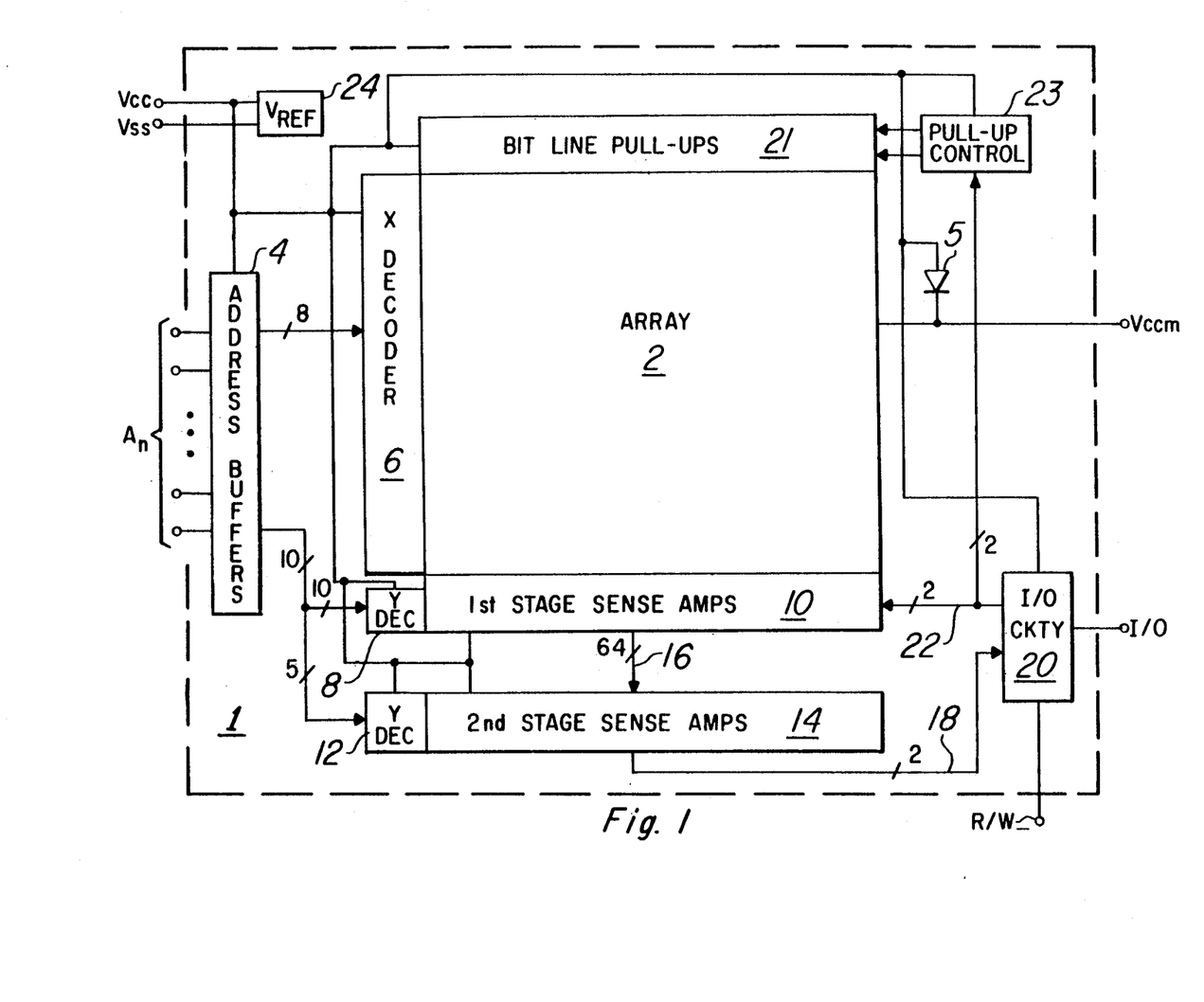
FIG. 1 is an electrical diagram, in block form, of a static random access memory (SRAM) incorporating the invention.

Referring now to FIG. 1, a block diagram of a static random access memory (SRAM) 1 is illustrated. This embodiment of SRAM 1 is a 256k bit memory, having a single input/output terminal I/O (i.e., SRAM 1 is organized as a 256k by 1 memory). The storage elements of SRAM 1 are contained in array 2, which in this embodiment is organized into 256 rows by 1024 columns. SRAM 1 receives address information on address inputs $A_n$. To individually address each bit within the 256k bit memory, address inputs $A_n$ number eighteen. Of course, if more than one bit were to be accessed at a time (for example, if 256k bit SRAM 1 were organized as a 32k by 8 memory, having eight inputs and eight outputs), fewer address inputs $A_n$ would be required.

Address inputs $A_n$ are received by address buffers 4 which, as is well known in the art, latch and retain the value of the address externally presented at address inputs $A_n$. Eight of the eighteen address bits received by address buffers 4, such eight bits corresponding to a row address, are communicated to row, or X, decoder 6, for selecting one of the 256 rows in array 2. The remaining ten bits received by address buffers 4, corresponding to a column address, are communicated to first stage column, or Y, decoder 8, for selection of one of the 1024 columns in array 2 to be sensed by one of the 1024 first stage sense amplifiers 10. Each of the 1024 columns, and accordingly each of the 1024 first stage sense amplifiers, are associated with a complementary pair of bit lines, as will be described hereinbelow, and the selected one of the 1024 first stage sense amplifiers senses the differential voltage of the complementary bit lines. A bank of bit line pull-up transistors 21 are provided in SRAM 1, as will be explained in further detail below.

Five of the ten column address bits are also communicated to second stage Y decoder 12, for selection of one of the second stage sense amplifiers 14. While FIG. 1 illustrates two separate Y decoders 8 and 12, second stage column, or Y, decoder 12 may alternatively be incorporated into first stage Y decoder 8. Such incorporation would use the output of the second stage sense amplifier 14 not only to select the appropriate second stage sense amplifier 14 but also in the decoding of the column address signal to select one of the first stage sense amplifiers 10, if multiple decoding stages are desired within first stage Y decoder 8 and if the break between decode stages therewithin is made at the point necessary to select one of the second stage sense amplifiers 14. The 1024 first stage sense amplifiers 10 are grouped into thirty-two groups of thirty-two, with each group having a complementary pair of local data lines 16 as an output. One of second stage sense amplifiers 14 is associated with each group of thirty-two first stage sense amplifiers, and receives at its input the associated pair of local data lines 16. A complementary pair of data-out lines 18 are driven by second stage sense amplifiers 14. In operation, the first stage sense amplifier 10 which corresponds to the column address is enabled by a signal from first stage Y decoder 8, while Y decoder 8 disables the others of first stage sense amplifiers 10 from sensing the data state of its associated pair of bit lines from array 2. The one of second stage sense amplifiers 14 which corresponds to the group of first stage sense amplifiers 10 having the selected column is also enabled, and the others of second stage sense amplifiers 14 are disabled. The selected one of second stage sense amplifiers 14 presents, on data-out lines 18, a differential voltage which is the amplification of the differential voltage on the local data lines 16 at its input, for communication to input/output circuitry 20. Input/output circuitry 20 communicates the state of data-out lines 18 to input/output terminal I/O.

Input/output circuitry 20 of SRAM 1 of FIG. 1 also receives input data from input/output terminal I/O; the determination of whether a read or a write cycle is desired depends upon the state of terminal R/W_, connected to input/output circuitry 20. During a write cycle, input/output circuitry 20 presents the logic state externally presented at input/output terminal I/O onto data-in bus 22, which presents the true and complement states of the input data to first stage sense amplifiers 10 for communication to the selected memory cell in array 2. Data-in bus 22 is also connected to pull-up control circuitry 23, to effect the write recovery operation described, in further detail hereinbelow.

SRAM 1 also has reference voltage circuit 25, which receives the power supply voltages $V_{cc}$ and $V_{ee}$ (ground potential). Power supply voltages $V_{cc}$ and $V_{ee}$ are routed to transistors throughout SRAM 1 for biasing purposes, such routing not shown in FIG. 1 for purposes of clarity. The particular embodiment of SRAM 1 described herein is a BiCMOS SRAM, utilizing both bipolar transistors, as well as p-channel and n-channel MOS transistors. Certain circuits in this embodiment of SRAM 1 are realized in emitter-coupled logic. Where emitter-coupled logic is used, reference voltage circuit 25 provides a band-gap reference voltage.

Figure 2:
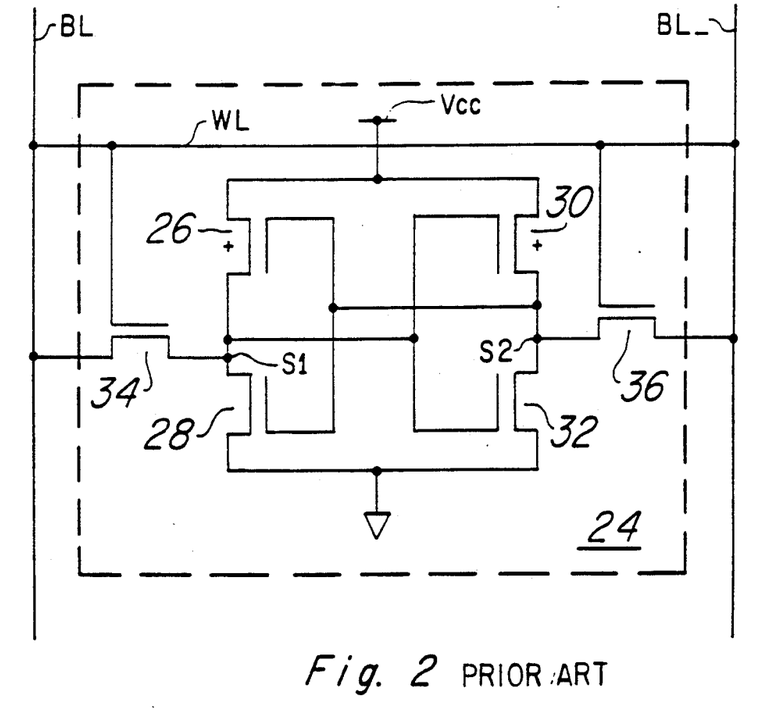
FIG. 2 is an electrical diagram, in schematic form, of a conventional CMOS memory cell as can be used in the SRAM of FIG. 1.

Referring now to FIG. 2, a conventional CMOS static memory cell 24 as incorporated into BiCMOS SRAM 1 is illustrated. Memory cell 24 is constructed according to the well-known cross-coupled inverter realization; since both p-channel and n-channel transistors are available, CMOS inverters are used in memory cell 24. A first CMOS inverter in memory cell 24 is made up of p-channel transistor 26 and n-channel transistor 28 having their source-to-drain paths connected in series between $V_{cc}$ and ground, and having their gates tied together. The second CMOS inverter in memory cell 24 is similarly constructed, with p-channel transistor 30 and n-channel transistor 32 having their source-to-drain paths connected in series between $V_{cc}$ and ground, and their gates also common. The cross-coupling is accomplished by the gates of transistors 26 and 28 being connected to the drains of transistors 30 and 32 (node S1 of FIG. 2), and by the gates of transistors 30 and 32 being connected to the drains of transistors 26 and 28 (node S2 of FIG. 2). N-channel pass transistor 34 has its source-to-drain path connected between node S1 and a first bit line BL, and has its gate connected to word line WL. N-channel pass transistor 36 similarly has its source-to-drain path connected between node S2 and a second bit line BL_, and has its gate also connected to word line WL.

In operation, the voltages of node S1 and S2 will necessarily be logical complements of one another, due to the cross-coupled nature of the CMOS inverters within memory cell 24. When word line WL is energized by X decoder 6 shown in FIG. 1, according to the row address received at address inputs $A_n$, pass transistors 34 and 36 will be turned on, coupling nodes S1 and S2 to bit lines BL and BL_, respectively. Accordingly, the state of bit lines BL and BL_ will be logical complements of one another when a memory cell 24 is connected thereto by the energizing of word line WL.

As described above for this embodiment, there are 256 word lines WL and 1024 pairs of bit lines BL and BL_ in array 2 of FIG. 1. For each value of the row address decoded by X decoder 6, one word line WL will be energized, connecting 1024 memory cells 24 to the 1024 pairs of bit lines BL and BL_. Since the other 255 word lines WL will be at a low logic level, only the one memory cell 24 associated with the selected word line WL in each column will be connected to the pair of bit lines BL and BL_ at a time.

Figure 3:
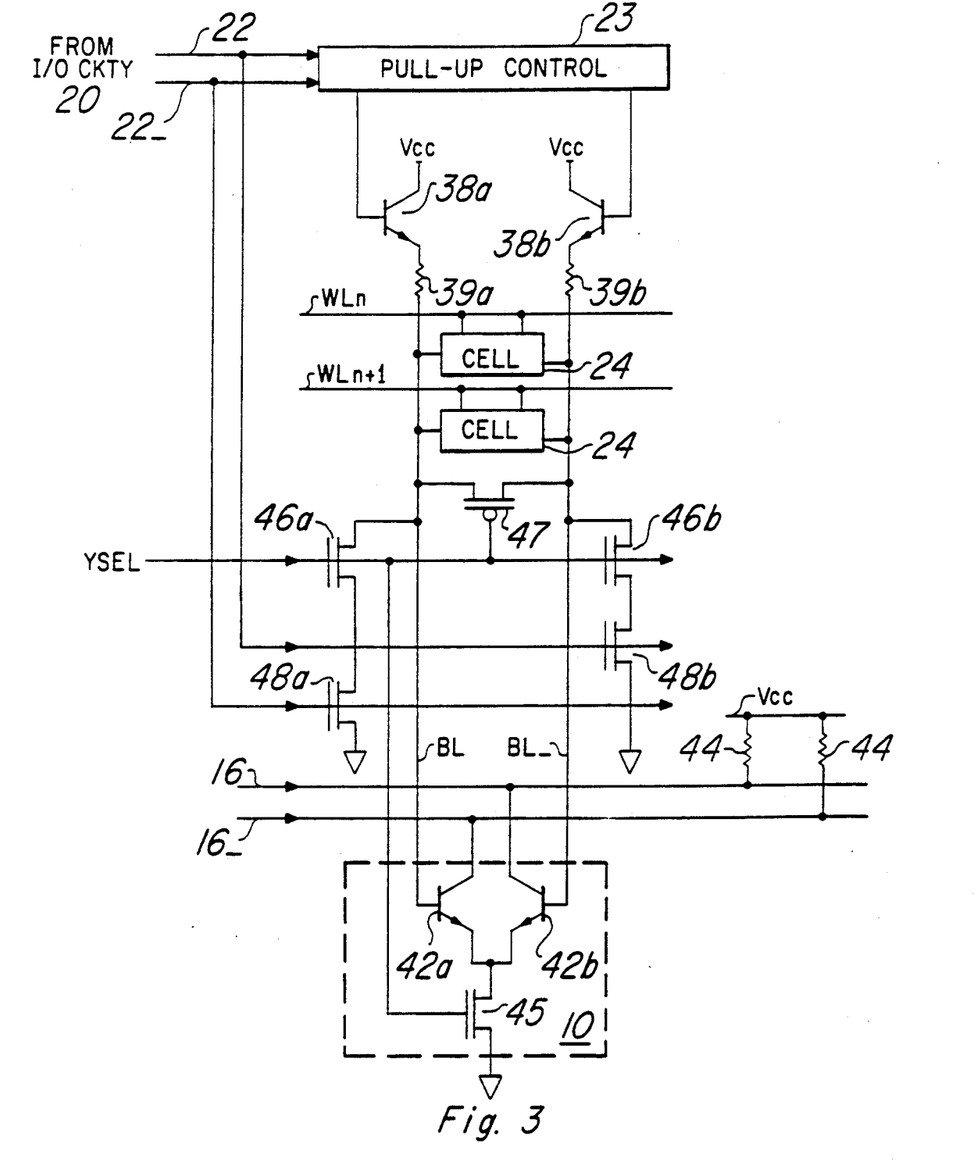
FIG. 3 is an electrical diagram, in schematic form, of a bit line pair in conjunction with the bit line pull-up circuitry and first stage sense amplifier.

Referring now to FIG. 3, a column of array 2 is illustrated. Only two memory cells 24 are illustrated, in conjunction with only two word lines $WL_n$ and $WL_{n+1}$, for purposes of clarity; as described above, each column has 256 memory cells 24 associated with 256 independent word lines WL. In the column shown in FIG. 3, cells 24 are shown connected to complementary bit lines BL and BL_. Bit lines BL and BL_ are connected to first stage sense amplifier 10 and, via n-p-n pull-up transistors 38a and 38b, respectively, to $V_{cc}$. Pull-up transistors 38 correspond to bit line pull-ups 21 shown in FIG. 1. The bases of pull-up transistors 38a and 38b are driven by pull-up control circuitry 23, which receives clocked input data from input/output circuitry 20 on data-in bus 22.

Figure 9A:
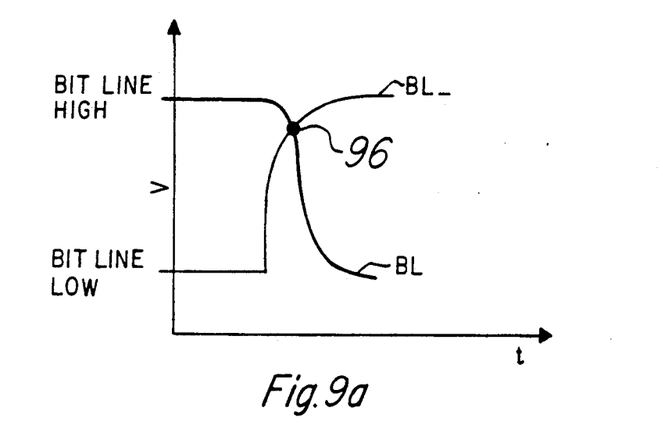
FIGS. 9a and 9b are timing diagrams illustrating the crossover points of the bitlines in successive read operations.
Figure 9B:
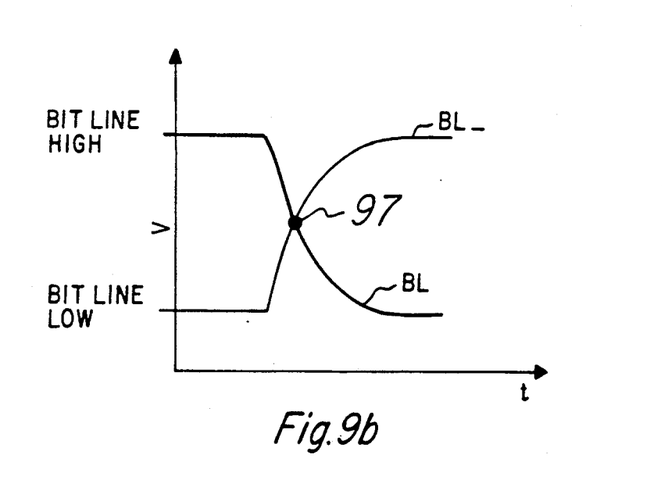

Resistors 39a and 39b serve to increase the differential voltage between bit lines BL and BL_ as well as to optimize the crossover point of bit lines BL and BL_ between read cycles which present opposite data states on the bit lines BL and BL_. Without resistors 39a and 39b, the pull-up characteristic would be dependent solely on the base-emitter diode of transistors 38a and 38b. In this case, the crossover point 96, illustrated in FIG. 9a, would be nearer to the bit line high voltage and, therefore, more sensitive to noise. With the value of resistors 39a and 39b in this exemplary embodiment approximately 100 ohms, the crossover point 97 is centered near the midpoint of the bit line high and bit line low voltages, as illustrated in FIG. 9b. In this manner, the maximum voltage margin is obtained.

First stage sense amplifier 10 consists of two emitter-coupled n-p-n transistors 42a and 42b, which have their bases connected to bit lines BL and BL_, respectively. The emitters of transistors 42a and 42b are connected to the drain n-channel transistor 45, which has its source coupled to ground and its gate connected to line YSEL. Transistor 45 is turned off when the column is not selected (i.e., line YSEL low), and is turned on to act as a current source when the column is selected (i.e., line YSEL high). Line YSEL also is connected to p-channel transistor 47, which serves to equalize bit lines BL and BL_ when transistor 47 is on due to line YSEL low. Line YSEL, for a particular column, is low during cycles in which the column is not selected, equalizing bit lines BL and BL_. The collectors of transistors 42a and 42b are connected to local data lines 16_ and 16, respectively. As described above for this embodiment, thirty-two first stage sense amplifiers 10 share local data lines 16 and 16_. Local data lines 16 and 16_ are pulled up to $V_{cc}$ by resistors 44. Transistors 43a and 43b are configured as diodes and connected between $V_{cc}$ and local data lines 16 and 16_, in parallel with resistors 44.

The write circuitry for a particular column consists of n-channel transistors 48a and 48b, which have their source-to-drain paths connected in a path between bit lines BL and BL_, respectively, and ground. The gates of n-channel transistors 48a and 48b are controlled by data-in lines 22_ and 22, respectively, one of which is taken to a high logic level at the time that a write operation is to occur, with the choice between data-in line 22 and 22_ depending upon the input data received at input/output terminal I/O. During read cycles, both data-in lines 22 and 22_ remain at a low logic level. N-channel transistors 46a and 46b are connected in series between transistors 48a and 48b, on the one hand, and bit lines BL and BL_, respectively, on the other hand. The gates of both of transistors 46a and 46b are controlled by line YSEL, so that the state of data-in lines 22 and 22_ affects only the selected one of the 1024 columns, and is isolated from the other columns.

Figure 4A:
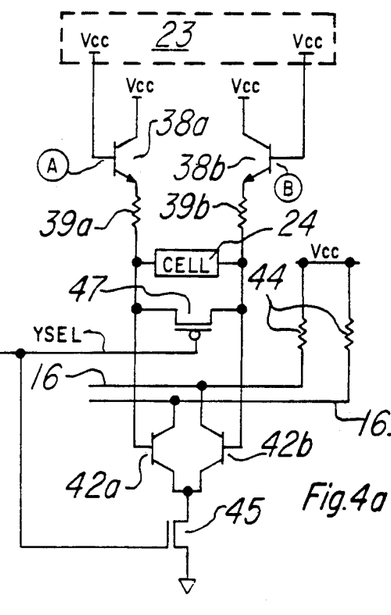
FIGS. 4a and 4b are electrical diagrams, in schematic form, illustrating biasing of the pull-up transistors for read and write cycles according to the invention.
Figure 5:
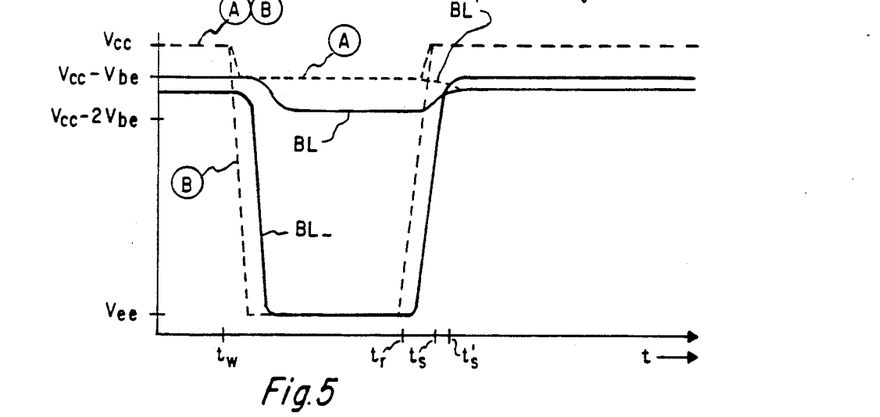
FIG. 5 is a timing diagram showing the operation of the column of FIG. 3 during read and write cycles.

FIG. 4a illustrates the equivalent circuit for a selected column of FIG. 3 in a read operation. FIG. 5 is a timing diagram showing, in the first cycle therein, the operation of the read cycle. During a read cycle, both of data-in lines 22 and 22_ of FIG. 3 will be at a low logic level. Responsive thereto, pull-up control circuitry 23 will present $V_{cc}$ to the bases of each of pull-up transistors 38a and 38b (nodes A and B on FIGS. 4a and 5) so that the voltage at the emitters of transistors 38a and 38b is the same, $V_{cc}-V_{be}$, where $V_{be}$ is the forward-biased diode drop across the base-emitter junction. The memory cell 24 selected by its word line WL will present a differential voltage on bit lines BL and BL_.

The following description is for the case where bit line BL is high relative to bit line BL_; the opposite data state will, of course, operate similarly with complementary states on bit lines BL and BL_. Referring to FIG. 2, with node S2 of memory cell 24 at a logic "1", or high level, current $i_m$ will flow into the memory cell through transistor 32 to pull bit line BL_ down. The current $i_m$ is higher than the current $i_b$ in bit line BL, which is the current into the base of transistor 42a. In addition to the difference in the forward biased diode dope across the base-emitter junctions of transistors 38a and 38b, there will be a larger voltage drop across resistor 39b than across 39a in this case, due to the higher current $i_m$ relative to $i_b$. The resultant differential voltage between bit lines BL and BL_ is thus according to the following relationship:

$$dVBL = dVBE + R39(i_m - i_b)$$

where dVBE is the difference in the forward biased diode drop across the base-emitter junctions of transistors 38a and 38b, and where R39 is the value of resistors 39a and 39b. Since transistor 45 is on, and acts as a current source to keep the sum of the currents through transistors 42a and 42b constant, the higher drive at the base of transistor 42a will cause the bulk of the current through transistor 45 to flow through transistor 42a relative to transistor 42b. In this way, the larger differential voltage on bit lines BL and BL_ due to resistors 39a and 39b will increase the differential collector current through transistor 42a relative to transistor 42b. This increased differential collector current directly translates into a larger amplitude signal from first stage sense amplifier 10.

Since transistor 42a is conducting the bulk of the current passing through transistor 45, relative to transistor 42b, local data line 16_ will be pulled low, while local data line 16 will remain high due to the minimal drive through transistor 42b. The other first stage sense amplifiers 10 which share local data lines 16 and 16_ will have their respective transistors 45 turned off, so that the only transistor pulling down one of data lines 16 and 16_ will be the transistor 42a or 42b driven by the higher bit line BL or BL_ associated with the selected column.

Figure 4B:
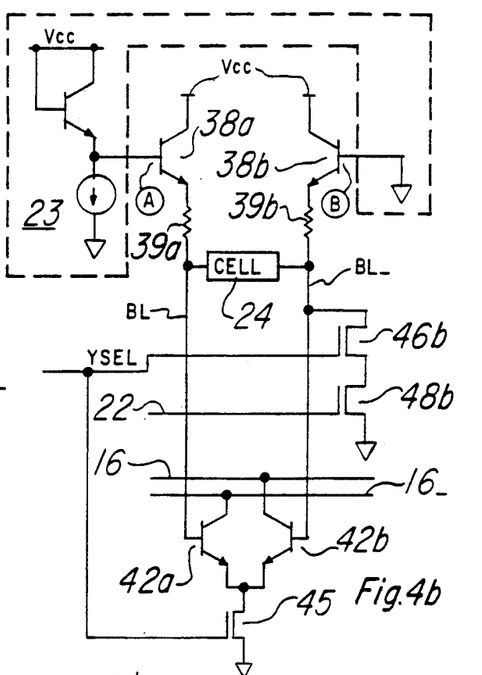

FIG. 4b illustrates the equivalent circuit during a write operation for a column constructed according to the invention and shown in FIG. 3. One of the data-in lines 22 or 22_ will be pulled to a high level by input- /output circuitry 20, depending upon the input data received at input/output terminal I/O; in the example explained herein, data-in line 22 will be pulled to a high logic level for the write operation. This occurs at time $t_w$ shown on FIG. 5. Accordingly, transistor 48b of the column of FIG. 3 will be turned on by data-in line 22; since YSEL is asserted to a high level for the selected column, transistor 48b selects bit line BL__ to be pulled to a low level to effect the write, as illustrated in FIG. 4b.

According to the invention, pull-up control circuitry 23 presents differing levels of bias to the bases of pull-up transistors 38a and 38b, depending upon the data state to be written, beginning at time $t_w$ at the beginning of a write operation. At node B, i.e., the base of transistor 38b, pull-up control circuitry will apply $V_{ee}$, since transistor 38b is associated with the bit line BL__ which is to be pulled to a low level since data-in line 22 (rather than line 22__) is pulled high. According to the invention, beginning at time $t_w$, pull-up control circuitry 23 applies to node A (the base of transistor 38a) a voltage which is reduced from the bias applied during the read cycle. In this embodiment, the applied voltage is one diode drop ($V_{be}$) below $V_{cc}$, due to transistor 50a biasing the base of transistor 38a. Accordingly, on the "high" bit line (the bit line opposite the one being pulled low which, in this case, is bit line BL), pull-up transistor 38a will be biased to be conductive, but so that the voltage at the emitter of pull-up transistor 38a is at a reduced voltage relative to the read cycle. In this case, the voltage of the high bit line BL is at $V_{cc}-2V_{be}$ during the write operation, while the voltage of the low bit line BL__ is pulled down to $V_{ee}$.

The write is accomplished since transistors 46b and 48b pull bit line BL__ to $V_{ee}$, setting node S2 in memory cell 24 (referring to FIG. 2) to a low level, so that the cross-coupled inverters in memory cell 24 latch the desired data state. The low level on bit line BL__ will turn transistor 42b off in first stage sense amplifier 10. Even though transistor 42a will conduct all of the current allowed through transistor 45 (its base being at a voltage $V_{cc}-2V_{be}$ which is sufficient to keep transistor 42a on), the current allowed into the base of transistor 42a is limited so that bit line BL will remain at approximately the voltage $V_{cc}-2V_{be}$. The effect of the low level of bit line BL__ through transistors 46b and 48b will be to override first stage sense amplifier 10, writing the desired data into memory cell 24. Once node S2 of memory cell 24 and the parasitic capacitance of bit line BL__ are discharged, the voltage of bit line BL__ will drop approximately to the voltage $V_{ee}$, as shown in FIG. 5.

The full benefit of the reduced bias of transistor 38a on the high bit line BL during the write operation is evidenced during the time after a write operation, and prior to a read operation (i.e., the write recovery time). Referring to FIG. 5, the end of the write cycle begins, at time $t_r$, with the one of data-in lines 22 or 22__ (in this case line 22) going from a high to a low logic level. This turns off transistor 48a, decoupling bit line BL__ from $V_{ee}$ and allowing it to become responsive to pull-up transistor 38b, in this example. Also responsive to data-in line 22 returning to a low level, pull-up control circuitry 23 returns the bias on the bases of transistors 38a and 38b (nodes A and B, respectively), to $V_{cc}$. For the bit line which was low in the prior write cycle, e.g., bit line Bl__, this biasing of pull-up transistor 38b pulls bit line BL__ back up toward $V_{cc}-V_{be}$, as in the read cycle described earlier. For the bit line which was high in the prior write cycle, e.g., bit line BL, the biasing of pull-up transistor 38a pulls bit line BL from $V_{cc}-2V_{be}$ back toward $V_{cc}-V_{be}$, as in the earlier-described read cycle.

In the event that the data state of the selected memory cell 24 is the same state as that written by the write cycle, the two bit lines BL and BL__ will go back to the differential voltage as shown in the first read cycle of FIG. 5. No speed improvement will be evidenced in this example, since the voltages of bit lines BL and BL__ will not cross-over prior to settling to the read state. However, in the case where the data read by the second read cycle is opposite that written by the write cycle, the voltages of the bit lines BL and BL__ will cross-over at a time earlier after $t_r$ due to the reduced bias on the base of the pull-up transistor 38 on the high side during the write cycle. This case is illustrated in the second read cycle in FIG. 5, and obviously presumes that a memory cell 24 in a different row from that written to in the write cycle is read in the second read cycle (in order to read different data).

Since the high side bit line, in this case bit line BL, is being raised by pull-up transistor 38a from a lower voltage ($V_{cc}-2V_{be}$) to a higher voltage ($V_{cc}-V_{be}-dV$; dV being the delta voltage due to being the low side bit line in a read), the cross-over between the voltage of bit line BL and the voltage of bit line BL__ occurs at time $t_s$ shown in FIG. 5. At the time of the cross-over point ($t_s$), first stage sense amplifier 10 will flip to the proper data state as explained above, since the bit line of the high side (bit line BL__ in this case) will be driving its associated transistor 42 harder than will the bit line of the low side (BL), accomplishing the read. If the high side bit line from the prior write (e.g., bit line BL) were falling from a voltage $V_{cc}-V_{be}$ which is the same voltage as during the read cycle, the crossover point with bit line BL__ rising would not occur until a time after $t_s$. Waveform BL' shown on FIG. 5 illustrates the behavior of bit line BL in the event where the write bias on transistor 38a were the same during a write cycle as during a read; the later crossover point is illustrated in FIG. 5 as time $t_s'$. The access time improvement due to the varying bias on the high side pull-up transistor is the time difference between time $t_s'$ and time $t_s$.

Figure 6:
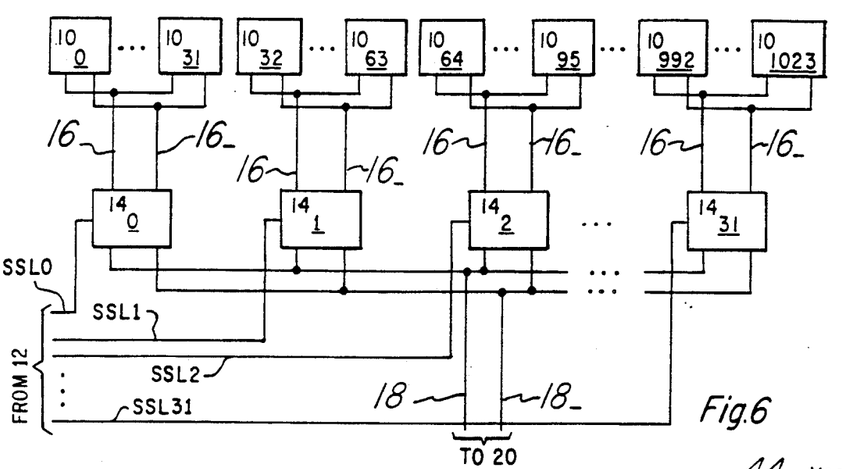
FIG. 6 is an electrical diagram, in block form, illustrating the interconnection of the first stage and second stage sense amplifiers.

Referring now to FIG. 6, the interconnection of the groups of first stage sense amplifiers 10 to the local data lines 16, and to their associated second stage sense amplifiers 14 will be described. As mentioned above, 1024 first stage sense amplifiers $10_0$ through $10_{1023}$ are grouped into groups of thirty-two, first stage sense amplifiers $10_0$ through $10_{31}$ being in a first group, first stage sense amplifiers $10_{32}$ through $10_{63}$ being in a second group, and so on. The output of each of the first stage sense amplifiers 10 in a group are wire-ANDed to a common pair of complementary local data lines 16 and 16__. Each pair of local data lines 16 from a group of first stage sense amplifiers 10 is presented to the inputs of the second stage sense amplifier 14 associated with the group. For example, second stage sense amplifier $14_0$ receives local data lines 16 and 16__ from first stage sense amplifiers $10_0$ through $10_{31}$.

One of the 1024 first stage sense amplifiers 10 is selected according to the ten bits of the column address to perform the sensing of the memory cell in the associated column which is in the selected row. This selection is accomplished by first stage Y decoder 8 which communicates a unique select line YSEL (not shown in FIG. 6)

to each of first stage sense amplifiers 10, depending upon the value of the ten-bit column address received at address inputs $A_n$ of FIG. 1. The unselected first stage amplifiers 10 are not enabled, and will present a high impedance to both of the complementary local data lines 16. The result of the sensing operation performed by the selected one of the first stage sense amplifiers 10 is presented on the pair of local data lines 16 by one of the pair of lines being pulled to a low level, as will be explained in greater detail below.

The second stage sense amplifier 14 which corresponds to the group of first stage sense amplifiers 10 containing the first stage sense amplifier 10 selected by the column address will be enabled, to amplify the differential voltage presented thereto on local data lines 16 and to present the amplified differential voltage on a complementary pair of data-out lines 18 and 18__. The selection is performed by second stage Y decoder 12 which receives, in this example, the five most significant bits of the column address and which asserts one of select lines SSL0 through SSL31 to second stage sense amplifiers 14 to enable it. The outputs of second stage sense amplifiers 14 are wire-ORed together at data-out lines 18 and 18__. Unselected ones of second stage sense amplifiers 14 are disabled, and present a high impedance to both of data-out lines 18, allowing the selected one of second stage sense amplifiers 14 to set the state of data-out lines 18 and 18__. As shown in FIG. 1, data-out lines 18 and 18__ are received by input/output circuitry 20 for communication to input/output terminal I/O.

Figure 7:
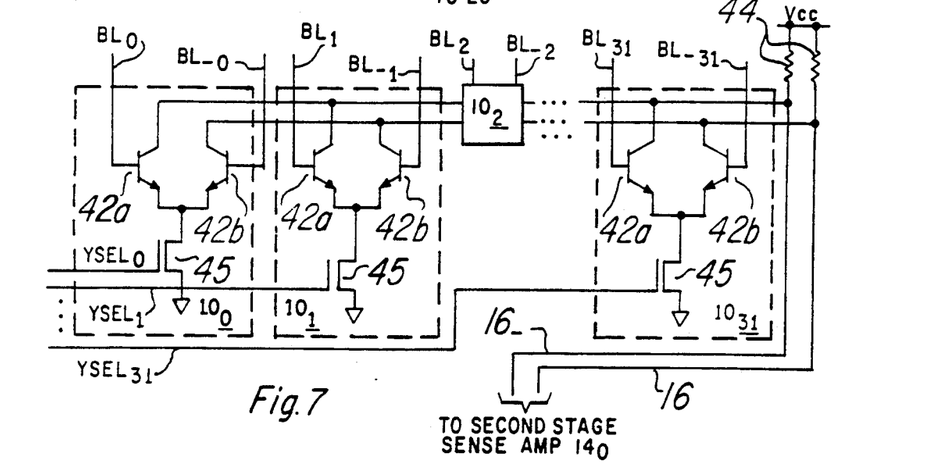
FIG. 7 is an electrical diagram, in schematic form, of the interconnection of a group of first stage sense amplifiers to a pair of local data lines.

Referring now to FIG. 7, the column decoding and sensing scheme of this embodiment of SRAM 1 will be explained. According to this embodiment of the invention and as described hereinabove relative to FIG. 1, one first stage sense amplifier 10 is associated with each of the 1024 columns in array 2. The first stage sense amplifiers 10 are grouped into thirty-two groups of thirty-two first stage sense amplifiers 10. FIG. 7 illustrates the interconnection of one group of thirty-two first stage sense amplifiers 10, and the driving of complementary local data lines 16.

First stage sense amplifiers $10_0$ through $10_{31}$ are schematically shown in FIG. 7. Each of said first stage sense amplifiers, as shown in FIG. 3, has transistors $42a$ and $42b$ having their bases connected to bit lines BL and BL__, respectively, and their collectors connected to local data lines 16__ and 16, respectively. The emitters of transistors $38a$ and $38b$ are connected together, for coupling to $V_{ee}$ through transistor 45. Each of first stage sense amplifiers 10 receives, at the gate of its transistor 45, a unique select signal on a line YSEL from first stage Y decoder 8. For example, first stage sense amplifier $10_0$ receives line $YSEL_0$, first stage sense amplifier $10_1$ receives line $YSEL_1$, and so on. As described above, each of the 1024 first stage sense amplifiers receives a unique select signal on its own associated line $YSEL_n$, where n ranges from 0 to 1023, since SRAM 1 described herein is organized as a 256k by 1 memory. Accordingly, only one of first stage sense amplifiers 10 is enabled for a given read operation by a high logic level on its associated select line YSEL, and the others of first stage sense amplifiers 10 not selected receive a low logic level on thei select lines YSEL.

For the group shown in FIG. 7, if none of the lines $YSEL_0$ through $YSEL_{31}$ is asserted by first stage Y decoder 8, all of the transistors 45 will be off for the first stage sense amplifiers $10_0$ through $10_{31}$. In this case, resistors 44 will pull both local data lines 16 and 16__ to $V_{cc}$, since none of first stage sense amplifiers $10_0$ through $10_{31}$ are enabled to pull either line low.

In the case where one of the first stage sense amplifiers $10_0$ through $10_{31}$ in the group shown in FIG. 7 is selected, those unselected first stage sense amplifiers 10 within the group still receive a low logic level on their associated select lines YSEL, keeping each of the transistors 45 in the unselected first stage sense amplifiers 10 in the off state. For the selected one of first stage sense amplifiers 10, however, a high logic level will be received on its select line YSEL, and its transistor 45 will be turned on, allowing sensing of the voltage differential on its associated pair of bit lines BL and BL__.

For example, assuming that line $YSEL_1$ goes to a high logic level due to first stage sense amplifier $10_1$ being selected, transistor 45 in first stage sense amplifier $10_1$ will be turned on. Accordingly, as described above, the one of transistors $42a$ and $42b$ which is associated with the higher of the bit lines $BL_1$ and $BL__1$ will be turned on more than the transistor $42a$ or $42b$ which is associated with the lower of the bit lines $BL_1$ and $BL__1$, the polarity of the differential voltage of course depending upon the data state stored in the memory cell 24 in the selected row. If, for example, the selected memory cell 24 stores data causing bit line $BL_1$ to be high relative to bit line $BL__1$, transistor $42a$ in first stage sense amplifier $10_1$ will be turned on more strongly than transistor $42b$ therein, dominating the conduction of the current passed by transistor 45 acting as a current source. Transistor $42a$ will thus act to pull down local data line 16__; the pulling down of local data line 16__ is not affected strongly by unselected first stage sense amplifiers $10_0$ and $10_2$ through $10_{31}$, since their transistors 45 are in the off state. The conduction through transistor $42b$ in first stage sense amplifier $10_1$ is minimal due to the effect of transistor 45, so local data line 16 will remain in a high state, communicating the result of the sensing operation by first stage sense amplifier $10_1$ to second stage sense amplifier $14_0$.

Transistors $43a$ and $43b$ prevent forward biasing of the collector-base junctions of transistors $42a$ and $42b$ by limiting the voltage drop across resistors 44. Lines 16 and 16__ are thus prevented from falling below $V_{cc}-V_{be}$. Since bit lines BL and BL__ will not be higher than $V_{cc}-V_{be}$, the bases of transistors $42a$ and $42b$ connected thereto will not have a higher voltage than their respective collectors. Therefore, transistors $42a$ and $42b$ will not be placed in an inoperable state due to forward bias of the collector base junction It should be noted that other conventional forms of diodes (such as junction diodes, or MOS transistors in diode configuration) may be used in the alternative to bipolar transistors connected in diode configuration such as transistors $43a$ and $43b$ of FIG. 3.

Figure 8:
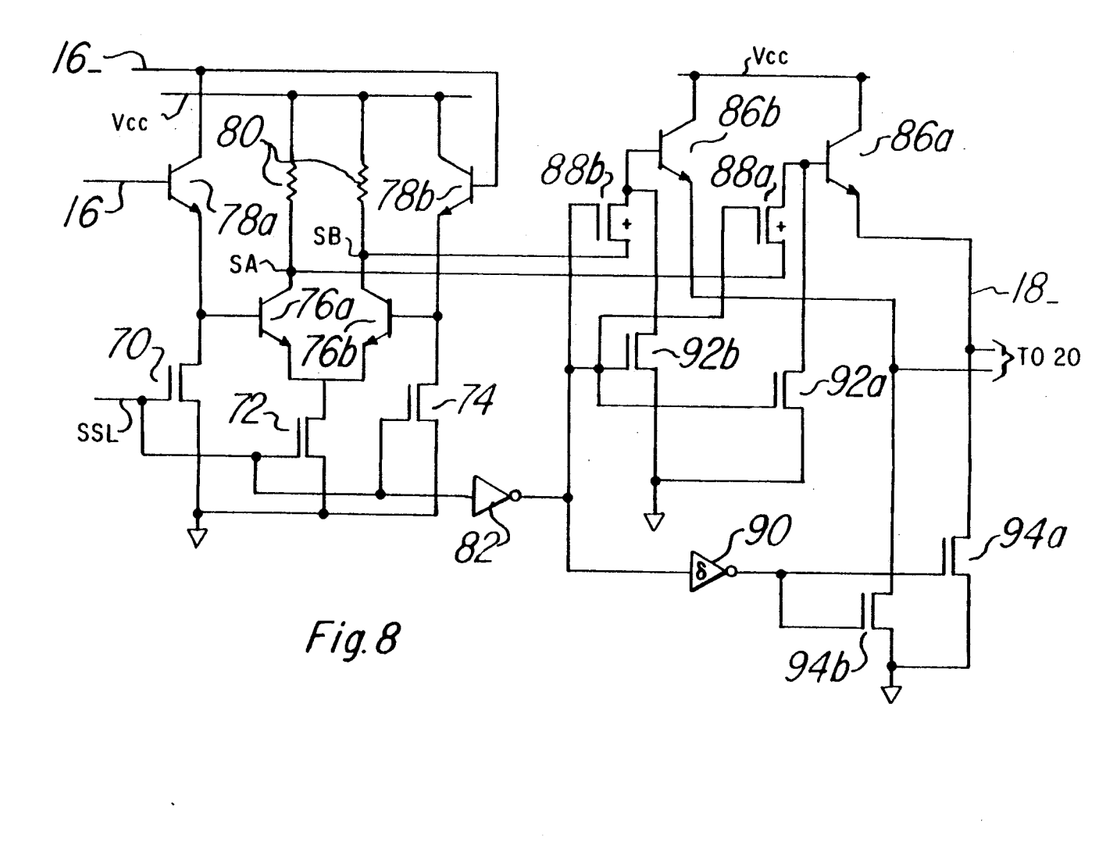
FIG. 8 is an electrical diagram, in schematic form, of a second stage sense amplifier.

Referring now to FIG. 8, the construction and operation of a second stage sense amplifier 14 will be explained in detail. On the input side of second stage sense amplifier 14, local data line 16 is connected to the base of n-p-n transistor $78a$, which has its collector connected to 16__ and its emitter connected to the base of n-p-n transistor $76a$ and to the drain of n-channel transistor 70. Transistor $76a$ has its collector connected through a pull-up resistor 80 to $V_{cc}$, and has its emitter connected to the drain of n-channel transistor 72. Similarly, local data line 16__ is connected to the base of n-p-n transistor $78b$ which has its collector connected to $V_{cc}$ and its emitter connected to the base of n-p-n transistor $76b$ and to the drain of n-channel transistor 74.

Transistor 76b has its collector connected through another pull-up resistor 80 to $V_{cc}$, and has its emitter connected to the drain of n-channel transistor 72. Transistors 70, 72 and 74 have their sources connected to $V_{ee}$. Line SSL from second stage Y decoder 12, is connected to the gates of n-channel transistors 70, 72 and 74.

In operation, when second stage sense amplifier 14 is not selected by second stage Y decoder 12, line SSL will be at a low logic level. Transistors 70, 72 and 74 will all be turned off, so that none of n-p-n transistors 78 and 76 will conduct current, regardless of the state of local data lines 16 and 16_. Accordingly, nodes SA and SB, at the collector of transistors 76a and 76b, respectively, will be pulled to $V_{cc}$ through resistors 80 in the unselected state.

When second stage sense amplifier 14 is selected, line SSL will be at a high logic state, turning on transistors 70, 72 and 74. In the selected condition, the input side of second stage sense amplifier 14 is enabled to detect the differential voltage between local data lines 16 and 16_. Transistors 78a and 78b communicate the voltages of local data lines 16 and 16_, respectively, reduced by a base-emitter diode drop ($V_{be}$), to the bases of transistors 76a and 76b, respectively. The input side of second stage sense amplifier 14 will thus operate in a similar manner as first stage sense amplifier 10, with transistor 72 serving as a current source for emitter-coupled transistors 76a and 76b. In the example discussed above, with local data line 16 at a higher voltage than local data line 16_, the majority of the current passed by transistor 72 will pass through transistor 76a rather than transistor 76b. Accordingly in this example, node SA will be at a lower voltage than node SB.

Looking now to the output side of second stage sense amplifier 14, p-channel transistor 88a has node SA connected to its drain, and has its source connected to the base of n-p-n transistor 86a. Similarly, node SB is connected to the drain of p-channel transistor 88b, which has its source connected to the base of n-p-n transistor 86b. Transistors 88a and 88b have their collectors connected to $V_{cc}$, and their emitters to data-out lines 18_ and 18, respectively. The bases of transistors 86a and 86b are also connected to the drain of n-channel transistors 92a and 92b, respectively, each of which has its source connected to $V_{ee}$. Line SSL, inverted by inverter 82, is connected to the gates of transistors 88a and 88b. Line SSL is also connected to the gate of transistors 92. Each of second stage sense amplifiers 14 has a pair of n-channel transistors 94a and 94b, with their source-to-drain paths connected between data-out lines 18_ and 18, respectively, and $V_{ee}$. The output of inverter 82, through inverting delay stage 90, drives the gates of transistors 94a and 94b. Inverting delay stage 90 consists of a CMOS inverter which has a relatively small p-channel pull-up transistor and a relatively large n-channel transistors pull-down transistor. This allows inverting delay stage 90 to have a substantial delay for one transition only, with the output of inverting delay stage 90 making a high-to-low transition quickly, but making a low-to-high transition relatively slowly, for the reasons described hereinbelow.

In operation, when second stage sense amplifier 14 is not selected, the output of inverter 82 will be at a high logic level. Accordingly, transistors 88 will be turned off, and transistors 92 will be turned on, pulling the bases of transistors 86 to $V_{ee}$ to turn them off. Accordingly, second stage sense amplifier 14 will be presenting a high impedance to data-out lines 18 and 18_; it should be noted that the others of the thirty-two second stage sense amplifiers 14 are connected to data-out lines 18 and 18_ in a similar manner as the second stage sense amplifier 14 shown in FIG. 8. Transistors 94a and 94b will also be turned off (in the steady state), so that unselected second stage sense amplifiers 14 present a high impedance to data-out lines 18 and 18_. The connection of the thirty-two second stage sense amplifiers 14 to data-out lines 18 and 18_ is thus in the nature of a wired-OR, with any one of the second stage sense amplifiers being able to pull up one of the data-out lines 18 or 18_ with the unselected ones of second stage sense amplifiers 14 presenting, essentially, a high impedance thereto.

When second stage sense amplifier 14 is selected, the output of inverter 82 will be at a low logic level, turning on transistors 88a and 88b. Transistors 92a and 92b will be turned off, to allow the full differential voltage of nodes SA and SB will be presented to the gates of transistors 84a and 84b, respectively. The voltages of nodes SA and SB will then in turn be connected to the bases of transistors 86a and 86b.

With line SSL going to a high state, the output of inverter 82 goes low, and the output of inverting delay stage 90 will eventually go to a high logic level to turn on transistors 94a and 94b. As described above, however, inverting delay stage 90 is constructed so that it slowly makes a low-to-high transition at its output. This delay caused by delay stage 90 between the output of inverter 82 and the gates of transistors 94a and 94b is such that transistors 94a and 94b are turned on at a point in time after transistors 86a and 86b have begun driving data-out lines 18_ and 18, respectively. The delay of turning on transistors 94a and 94b provides access time improvement where the data state to be presented on data-out lines 18 and 18_ is the same as the data presented thereupon in the previous read cycle. If, for example, data-out line 18 were driven to a high level relative to data-out line 18_ in the previous cycle by another second stage sense amplifier 14, transistor 86b will only have to maintain the same level as already on data-out line 18, providing for a fast output response, so long as transistor 86b begins driving data-out line 18 before transistor 94b turns on. If transistor 94b turned on prior to transistor 86b turning on, data-out line 18 would be discharged to $V_{ee}$, and transistor 86b would have to pull data-out line 18 all the way back up to its eventual output level, slowing the access time performance of SRAM 1. Once turned on by inverting delay stage 90, transistors 94a and 94b act as current sources, allowing the voltage of data-out lines 18 and 18_ to reflect the differential voltage of nodes SA and SB. The voltage presented to data-out lines 18_ and 18, respectively, is substantially the voltage of nodes SA and SB, shifted by the base-emitter diode drop of transistors 86a and 86b, respectively.

In the example described above, with node SB being at a higher voltage than node SA, data-out line 18 will be at a higher voltage than data-out line 18_. Second stage sense amplifier 14 thus communicates the output of the selected first stage sense amplifier 10, from sensing the data state of the selected memory cell 24, to input/output circuitry 20.

In a subsequent cycle where the particular second stage sense amplifier 14 goes from a selected state to an unselected state, line SSL will go to a low logic level, turning off transistors 70, 72, 74, 84a and 84b, and turning on transistors 92a and 92b so that the bases of transistors 86a and 86b are pulled low. Inverting delay stage 90 causes transistors 94a and 94b to quickly turn off, since inverting delay stage 90 is constructed so that its output can quickly make the high-to-low transition responsive to the output of inverter 82.

The above-described invention thus provides reduced load on the first stage sense amplifiers 10 by grouping a reduced number of first stage sense amplifiers 10 to drive a pair of local data lines 16 and 16_, and by having a second stage sense amplifier for each group, selected by the most significant bits of the column address, to drive the global data-out lines 18 and 18_. The reduced drive allows for the provision of a single first stage sense amplifier 10 for each column, without requiring large drive transistors which may not fit within the column pitch of the array.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A memory device comprising:
   an array of memory cells arranged in rows and columns;
   a row decoder for selecting a row of said array responsive to a row address portion of a row address signal;
   a plurality of bit line pairs, each of said bit line pairs associated with a column of memory cells for carrying a differential signal from a memory cell in that column in a selected row;
   first and second pull-up transistors associated with each bit line pair; and
   first and second resistors connected between said first and second pull-up transistors and first and second bit lines in said bit line pair, said first and second resistors providing an increased voltage difference between said first and second bit lines.

2. The memory device of claim 1, wherein said memory comprises a plurality of first stage sense amplifiers, grouped into a first group and a second group, each of said first stage sense amplifiers associated with a bit line pair;
   first and second local data buses;
   a first second stage sense amplifier connected to said first group of said first stage sense amplifiers via said first local data bus;
   a second second stage sense amplifier connected to said second group of said first stage sense amplifiers via said second local data bus;
   column decode means for selecting a first stage sense amplifier responsive to a column address portion of said address signal, and for selecting a second stage sense amplifier responsive to said column address portion of said column address signal, said column decode means selecting the second stage sense amplifier responsive to at least one of the bits of said column address portion of said address signal used in selecting a first stage sense amplifier.

3. The memory of claim 2, further comprising:
   a first pull-up resistor connected between a first reference voltage and said first local data bus;
   a second pull-up resistor connected between said first reference voltage and said second local data bus;
   means for limiting the voltage drop across said second pull-up resistor.

4. The memory of claim 3, wherein said means for limiting the voltage drop across said first pull-up resistor comprises a first diode connected in parallel with said first pull-up resistor;
   and wherein said means for limiting the voltage drop across said second pull-up resistor comprises a second diode connected in parallel with said second pull-up resistor.

5. The memory of claim 3, wherein said means for limiting the voltage drop across said first pull-up resistor comprises:
   a first clamp transistor with a current path connected between said first reference voltage and said first local data bus, said first clamp transistor having a control electrode connected to the first reference voltage;
   and wherein said means for limiting the voltage drop across said second pull-up resistor comprises:
   a second clamp transistor with a current path between said first reference voltage and said second local data bus, said second clamp transistor having a control electrode connected to the first reference voltage.

6. The memory of claim 2, wherein said column decode means comprises:
   a second stage column decoder, for receiving a predetermined number of the most significant bits of the column address portion of said address signal, for selecting a second stage sense amplifier responsive thereto; and
   a first stage column decoder, for receiving the column address portion of said address signal, for selecting a first stage sense amplifier responsive thereto.

7. The memory of claim 2, wherein each of said first stage sense amplifiers comprises:
   a current source coupled to a second reference voltage;
   a first transistor having a conductive path connected between the local data bus associated with its group and said current source, and having a control electrode connected to said first bit line of said pair of bit lines; and
   a second transistor having a conductive path connected between the local data bus associated with its group and said current source, and having a control electrode connected to said second bit line of said pair of bit lines.

8. The memory of claim 7, wherein said first and second transistors are bipolar transistors.

9. The memory of claim 8, wherein said memory cells are comprised of cross-coupled CMOS inverters.

10. The memory of claim 1, wherein said memory cells are comprised of cross-coupled CMOS inverters.

11. A read-write memory, comprising:
    an array of memory cells arranged in rows and columns;
    a plurality of bit line pairs, each of said bit line pairs associated with a column of memory cells for carrying a differential signal from a selected memory cell;

a plurality of first stage sense amplifiers, each associated with a bit line pair, and each comprising a bipolar transistor having its base connected to a bit line of said bit line pair;

a pull-up circuit associated with each bit line pair, comprising first and second pull-up transistors, and first and second resistors connected between said first and second pull-up transistors and said first and second bit lines in said bit line pair, respectively;

a local data bus connected to the collector of each of said bipolar transistor in said first stage sense amplifiers;

a pull-up resistor connected between a first reference voltage and said local data bus;

a clamp device connected in parallel with said pull-up resistor for limiting the voltage drop across said pull-up resistor.

12. The memory of claim 11, wherein said clamp device is a diode.

13. The memory of claim 12, wherein said diode is a transistor connected in diode configuration.

14. The memory of claim 11, wherein said plurality of first stage sense amplifiers are grouped into first and second groups, said first group of first stage sense amplifiers having a first local data bus connected to the collectors of their bipolar transistors, and said second group of first stage sense amplifiers having a second local data bus connected to the collectors of their bipolar transistors; and further comprising:

first and second second stage sense amplifiers, said first second stage sense amplifier connected to the first local data bus, and said second second stage sense amplifier connected to the second local data bus;

wherein each of said first and second local data buses have pull-up resistors connected to said first reference voltage;

and wherein each of said first and second local data buses have clamp devices connected in parallel with said pull-up resistors.

15. The memory of claim 14, wherein said first stage sense amplifiers each comprise an emitter-coupled pair of bipolar transistors, each with their base connected to a bit line in its associated bit line pair;

wherein said local data buses each comprise a pair of lines, one of said lines connected to the collector of each of the bipolar transistors in said emitter-coupled pair;

and wherein one of said pull-up resistors and one of said clamp devices are connected in parallel between each line of said local data bus and said first reference voltage.

16. The memory of claim 11, wherein said first stage sense amplifiers each comprise an emitter-coupled pair of bipolar transistors, each with their base connected to a bit line in its associated bit line pair;

wherein said local data bus comprises a pair of lines, one of said lines connected to the collector of each of the bipolar transistors in said emitter-coupled pair;

and wherein one of said pull-up resistors and one of said clamp devices are connected in parallel between each line of said local data bus and said first reference voltage.

17. The memory of claim 11, wherein said memory cells are comprised of cross-coupled CMOS inverters.

* * * * *

UNITED STATES PATENT AND TRADEMARK OFFICE
CERTIFICATE OF CORRECTION

PATENT NO. : 5,093,806

DATED : 03/03/92

INVENTOR(S) : Hiep Van Tran

It is certified that error appears in the above-identified patent and that said Letters Patent is hereby corrected as shown below:

On the title page: Attorneys, Agents, or Firm:

Stanton C. Braden,

Douglas A. Sorensen,

Richard L. Donaldson,

Signed and Sealed this

Sixteenth Day of November, 1993

Attest:

BRUCE LEHMAN

Attesting Officer     Commissioner of Patents and Trademarks